(12) United States Patent
Fujii

(10) Patent No.: US 9,117,741 B2
(45) Date of Patent: Aug. 25, 2015

(54) SEMICONDUCTOR DEVICE

(71) Applicant: PS4 Luxco S.a.r.l., Luxembourg (LU)

(72) Inventor: Jun Fujii, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/748,218

(22) Filed: Jan. 23, 2013

(65) Prior Publication Data
US 2014/0042589 A1    Feb. 13, 2014

(30) Foreign Application Priority Data

Aug. 10, 2012  (JP) .................. 2012-177791

(51) Int. Cl.
*H01L 23/52* (2006.01)
*H01L 23/18* (2006.01)
*H01L 23/525* (2006.01)
*H01L 21/56* (2006.01)
*H01L 23/00* (2006.01)
*H01L 25/065* (2006.01)
*H01L 23/29* (2006.01)
*H01L 23/31* (2006.01)
*H01L 21/683* (2006.01)

(52) U.S. Cl.
CPC .............. *H01L 23/18* (2013.01); *H01L 21/561* (2013.01); *H01L 21/565* (2013.01); *H01L 23/5258* (2013.01); *H01L 24/97* (2013.01); *H01L 25/0657* (2013.01); *H01L 21/6836* (2013.01); *H01L 23/295* (2013.01); *H01L 23/3128* (2013.01); *H01L 2221/68327* (2013.01); *H01L 2224/32145* (2013.01); *H01L 2224/48091* (2013.01); *H01L 2224/48227* (2013.01); *H01L 2224/48465* (2013.01); *H01L 2224/49175* (2013.01); *H01L 2224/73265* (2013.01); *H01L 2224/92247* (2013.01); *H01L 2225/0651* (2013.01); *H01L 2225/06562* (2013.01); *H01L 2924/15311* (2013.01)

(58) Field of Classification Search
CPC ... H01L 24/97; H01L 23/5258; H01L 23/295; H01L 21/561; H01L 21/565; H01L 23/18; H01L 25/0657; H01L 2224/32145; H01L 2224/48227; H01L 2224/92247
See application file for complete search history.

(56) References Cited

U.S. PATENT DOCUMENTS

| | | | |
|---|---|---|---|
| 2005/0110127 A1* | 5/2005 | Kanemoto et al. | 257/686 |
| 2006/0091563 A1* | 5/2006 | Arai et al. | 257/778 |
| 2012/0001177 A1* | 1/2012 | Miyoshi et al. | 257/48 |
| 2013/0320571 A1* | 12/2013 | Kado et al. | 257/784 |

FOREIGN PATENT DOCUMENTS

| | | | |
|---|---|---|---|
| JP | 2004-22982 | * | 1/2004 |
| JP | 2006-54359 A | | 2/2006 |

* cited by examiner

Primary Examiner — A. Sefer

(57) ABSTRACT

The semiconductor device 200 includes a wiring substrate 201, a lower chip 203 mounted on a surface of the wiring substrate 201, and an upper chip 205 mounted on the lower chip 203, the lower chip 203 includes a plurality of fuse opening portions 113, each of the fuse opening portions 113 is fully covered with or fully exposed from the upper chip 205.

19 Claims, 9 Drawing Sheets

SEMICONDUCTOR DEVICE

The present application claims the benefit of priority from Japanese Patent Application No. 2012-177791, filed on Aug. 10, 2012, the disclosure of which is incorporated herein in its entirety by reference.

BACKGROUND OF THE INVENTION

1. Field of the Invention

The present invention relates to a semiconductor device.

2. Description of Related Art

In order to enhance the density of a semiconductor device, it is common to stack a plurality of semiconductor chips. Such a semiconductor device is called a multi-chip package (MCP) semiconductor device.

In a usual MCP semiconductor device, a plurality of semiconductor chips are stacked via adhesive layers and sealed with a molding resin.

At that time, a filler may be added to the molding resin in order to adjust the coefficient of thermal expansion, the mechanical strength, the fluidity, and the like.

However, if a molding resin to which a filler has been added is used for a MCP semiconductor device, the filler may be trapped between stacked semiconductor chips. Therefore, the semiconductor chips and terminals such as electrode pads formed on the semiconductor chips may be broken by the trapped filler.

Therefore, JP-A 2006-54359 (Patent Literature 1) discloses that the size of a filler included in a molding resin is set to be greater than the thickness of an adhesive layer for bonding semiconductor chips to thereby prevent the filler from being trapped between the semiconductor chips.

SUMMARY

In a case of a semiconductor device comprising a lower semiconductor chip with a fuse opening portion and an upper semiconductor chip located with an edge being located above the fuse opening portion, however, a filler in a molding resin may be trapped in the fuse opening portion located below the edge of the upper semiconductor chip even though the size of the filler is set to be greater than the thickness of an adhesive layer as disclosed in Patent Literature 1.

In this case, the filler trapped in the fuse opening portion may press circuits or wires near the fuse opening portion of the semiconductor chip under pressure applied when the molding resin is filled. Alternatively, the filler trapped in the fuse opening portion may press circuits or wires near the fuse opening portion when the molding resin is hardened and shrunk. Thus, the circuits or wires near the fuse opening portion may be broken by the filler trapped in the fuse opening portion. Additionally, even if a semiconductor device is not defective upon production, stress may be produced by differences of coefficients of thermal expansion when the semiconductor device is secondarily mounted on a motherboard or the like and changed in temperature. Thus, the filler trapped in the fuse opening portion may break circuits or wires near the fuse opening portion, thereby degrading the reliability of the semiconductor device.

Particularly, entrainment is caused near an air vent during molding. When a fuse opening portion located below an edge of a semiconductor chip is arranged near an air vent, which is located at an opposite side to a gate to which a molding resin is injected, then a filler is more likely to be trapped in the fuse opening portion.

Accordingly, there has been desired a semiconductor device that can prevent a filler from being trapped between semiconductor chips even if any semiconductor chip comprises a fuse opening portion formed therein.

In one embodiment, there is provided a semiconductor device comprising, a wiring substrate including a plurality of connection pads formed on a surface thereof; a lower chip having a rectangular shape in plan view, the lower chip including a plurality of electrode pads arranged along short sides of the lower chip, the lower chip being mounted over the surface of the wiring substrate, a plurality of bonding wires electrically connecting the plurality of connection pads to the plurality of electrode pads, an upper chip having a rectangular shape in plan view, the upper chip being stacked over the lower chip so that short sides of the upper chip are in parallel to long sides of the lower chip, and a center of the upper chip is shifted from a center of the lower chip in a direction in which the long sides of the lower chip extend, and a sealing member formed on the surface of the wiring substrate so that the lower chip and the upper chip are covered with the sealing member.

In another embodiment, there is provided a semiconductor device comprising, a wiring substrate, a lower chip mounted over a surface of the wiring substrate, the lower chip including a plurality of fuse opening portions, an upper chip stacked over the lower chip, a center of the upper chip is deviated from a center of the lower chip so that each of the plurality of fuse opening portions is fully covered with or fully exposed from the upper chip, and a sealing member formed on the surface of the wiring substrate so that the lower chip and the upper chip are covered with the sealing member.

In still another embodiment, there is provided a semiconductor device comprising, a substrate, a first chip including a surface that is defined by first and second edges opposite to each other and third and fourth edges opposite to each other, the first and second edges are shorter than the third and fourth edges, and the first chip being mounted over the substrate, a second chip including a surface that is defined by fifth and sixth edges opposite to each other and seventh and eighth edges opposite to each other, the fifth and sixth edges are shorter than the seventh and eighth edges, the second chip being stacked over the first chip so that the fifth and sixth edges are in parallel to the third and fourth edges, and a distance between the first edge and the seventh edge is larger than a distance between the second edge and the eighth edge, and a sealing member provided over the substrate to cover the first chip and the second chip.

Advantageous Effects of the Invention

According to the present invention, there can be provided a semiconductor device that can prevent a filler from being trapped between semiconductor chips even if any semiconductor chip comprises a fuse opening portion formed therein.

BRIEF DESCRIPTION OF DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

Preferred embodiments of the present invention will be described below with reference to FIGS. 1 to 12.

First, an outlined structure of a semiconductor device 200 according to a first embodiment of the present invention will be described with reference to FIGS. 1 to 3.

In this example, a semiconductor memory comprising memory chips mounted thereon is illustrated as an example of the semiconductor device 200.

Figure 1:
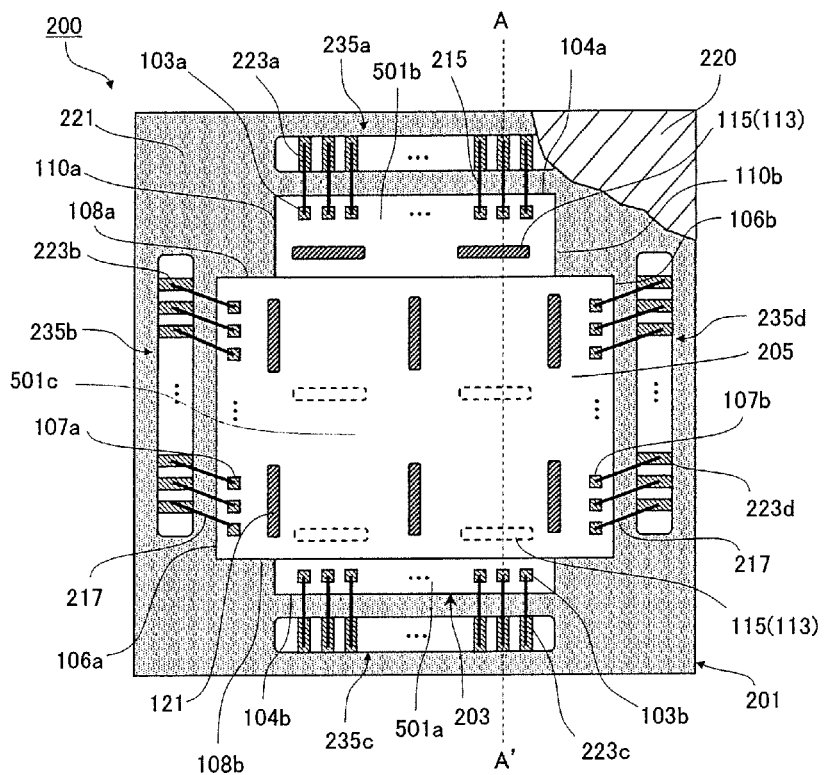
FIG. 1 is a plan view showing a semiconductor device according to a first embodiment of the present invention, in which only part of a sealing member is illustrated.
Figure 2:
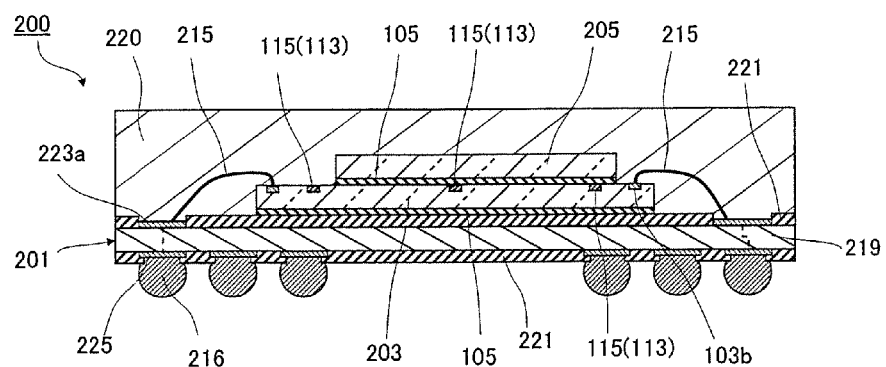
FIG. 2 is a cross-sectional view taken along line A-A' of FIG. 1.
Figure 3:
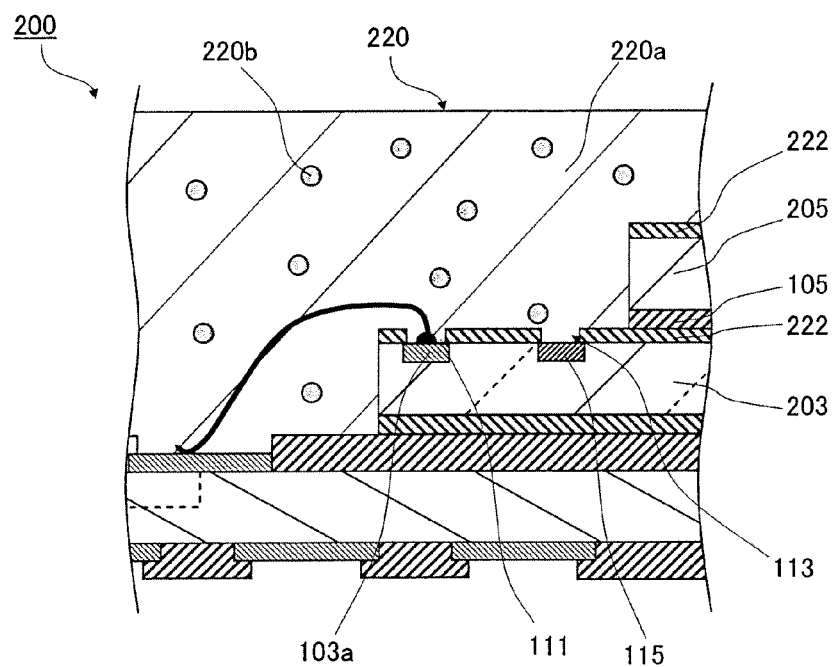
FIG. 3 is an enlarged view showing the vicinity of a fuse opening portion shown in FIG. 2.

As shown in FIGS. 1 to 3, the semiconductor device 200 comprises a wiring substrate 201, a lower chip 203 (first chip) mounted on a first surface of the wiring substrate 201, and an upper chip 205 (second chip) mounted on the lower chip 203. The lower chip 203 includes a plurality of fuse opening portions 113 formed therein. The upper chip 205 is mounted on the lower chip 203 so that each of the fuse opening portions 113 is fully covered with or fully exposed from the upper chip 205.

The semiconductor device 200 comprises wires 215 and 217 (bonding wires) connecting the wiring substrate 201 to the lower chip 203 and the upper chip 205, respectively. The semiconductor device 200 also comprises solder balls 216 serving as external terminals for connecting the semiconductor device 200 to an external device and a sealing member 220 provided on the first surface of the wiring substrate 201 so that the first surface of the wiring substrate 201 is covered with the sealing member 220. The sealing member 220 includes a filler 220b therein.

Detailed components of the semiconductor device 200 in the first embodiment of the present invention will be described below with reference to FIGS. 1 to 3.

The wiring substrate 201 includes an insulating base material 219 formed of a glass epoxy substrate that is substantially in the form of a rectangular plate (rectangular shape in plan view), wiring layers (not shown) patterned on both sides of the insulating base material 219, and insulator films 221 formed so that the wiring layers are covered with the insulator films 221. A plurality of connection pads 223a, 223b, 223c, and 223d are connected to the wiring layer of the wiring substrate 201 that is located on the first surface of the wiring substrate 201. Furthermore, a plurality of land portions 225 are connected to the wiring layer of the wiring substrate 201 that is located on a second surface of the wiring substrate 201. As shown in FIG. 1, the connection pads 223a, 223b, 223c, and 223d are arranged on the first surface of the wiring substrate 211 near peripheral portions of four sides of the wiring substrate 211. The land portions 225 are arranged in a grid pattern on the second surface of the wiring substrate 201.

The connection pads 223a, 223b, 223c, and 223d and the land portions 225 are connected to each other by wires connected to the connection pads 223a, 223b, 223c, and 223d and the land portions 225, vias extending through the insulating base material 219, and the like.

The wires 215 are connected to the connection pads 223a and 223c, and the wires 217 are connected to the connection pads 223b and 223d. The solder balls 216 are mounted on the land portions 225.

For example, the insulator films 221 are formed of a solder resist (SR). The insulator films 221 are formed entirely on both surfaces of the wiring substrate 201 except predetermined areas. In other words, part of the insulator films 221 has been removed from the predetermined areas so that the insulating films 112 include one or more opening portions. For example, opening portions 235a, 235b, 235c, and 235d are formed in the first surface of the wiring substrate 211. The opening portions 235a, 235b, 235c, and 235d allow areas in which the connection pads 223a, 223b, 223c, and 223d are formed and the vicinity thereof to be exposed.

Opening portions are also formed in the second surface of the wiring substrate 201 so that the land portions 225 are exposed.

In this example, the lower chip 203 is formed of a semiconductor chip. The lower chip 203 is substantially in the form of a rectangular plate (rectangular shape in plan view) including short sides 104a and 104b (first and second edges) and long sides 110a and 110b (third and fourth edges). Some circuits and electrode pads 103a and 103b (first and second electrodes) are formed on a first surface of the lower chip 203. The electrode pads 103a and 103b are arranged along the short sides 104a and 104b of the rectangular shape of the lower chip 203. The lower chip 203 also includes fuse regions 115 formed on the first surface of the lower chip 203. Furthermore, as shown in FIG. 3, a protective film 222 (e.g., a passivation film) is formed on the first surface of the lower chip 203 for protecting a circuit formation surface. The protective film 222 includes pad opening portions 111 and fuse opening portions 113 formed therein so that the electrode pads 103a and 103b and the fuse regions 115 are exposed.

Fuses (not shown) are formed in the fuse regions 115. When any defective memory cell is found by a test performed on the lower chip 203 in a state of a wafer, a corresponding fuse is cut by laser or the like. Thus, the defective memory cell is switched to a reserve memory cell. Therefore, the semiconductor chip is recovered even if it partially includes a defective memory cell. For example, the fuse regions 115 are arranged near each of blocks of the memory cells. In FIG. 1, each of the fuse regions 115 (fuse opening portions 113) has a rectangular shape or an elongated shape. Six fuse regions 115 are formed so that long sides of each of the fuse regions 115 are in parallel to the short sides 104a and 104b of the lower chip 203. The lower chip 203 includes a second surface bonded and fixed to an area of the wiring substrate 201 on which the insulator film 221 has been formed by an adhesive member 105 such as a die-attached film (DAF).

In this example, the upper chip 205 is formed of a semiconductor chip having the same structure as the lower chip 203.

Specifically, the upper chip 205 is substantially in the form of a rectangular plate (rectangular shape in plan view) including short sides 106a and 106b (fifth and sixth edges) and long sides 108a and 108b (seventh and eighth edges). Some circuits and electrode pads 107a and 107b are formed on a first surface of the upper chip 205. The electrode pads 107a and 107b are arranged along the short sides 106a and 106b of the rectangular shape of the upper chip 205. The upper chip 205 includes fuse regions 121 formed in the first surface of the upper chip 205. Six fuse regions 121 are formed so that long sides of each of the fuse regions 121 are in parallel to the short sides 106a and 106b of the upper chip 205.

The upper chip 205 is stacked over the lower chip 203.

More specifically, the upper chip 205 is stacked over the lower chip 203 via an adhesive member 105, such as a DAF, in a state in which the upper chip 205 has been rotated through 90 degrees (the short sides 106a and 106b of the upper chip 205 face the long sides 110a and 110b of the lower chip 203, respectively). In other words, the upper chip 205 is stacked over the lower chip so that the short sides 106a and 106b of the upper chip 205 are in parallel to the long sides 110a and 110b of the lower chip 203, and a center of the upper chip 205 is deviated from a center of the lower chip 203. Furthermore, the upper chip 205 is stacked over the lower chip 203 so that each of edges of the upper chip 205 is not located above the fuse opening portions 113 of the lower semiconductor chip. In other words, the upper chip 205 is stacked over the lower chip 203 so that each of the fuse opening portions 113 of the lower chip 203 is fully exposed from the upper surface 205 or fully covered with the upper chip 205 (so that the edge of the upper chip is not crossing the plurality of fuse regions).

Here, the lower chip 203 includes a first region 501a, a second region 501b, and a third region 501c defined between the first and second regions. the upper chip 205 is stacked over the third region 501c of the lower chip 203 so that the first region 501a including smaller an area than that of the second region 501b, and exposes all of the fuse opening portions 113 (fuse regions) formed in the second region. In other words, a distance between the short side 104a and the long side 108a is larger than a distance between the short side 104b and the long side 108b.

The arrangement and number of the fuse opening portions 113 are not limited to specific ones so long as the upper chip 205 is stacked over the lower chip 203 such that each of the fuse opening portions 113 of the lower chip 203 is fully exposed from the upper surface 205 or fully covered with the upper chip 205.

The upper chip 205 may not necessarily be formed of a semiconductor chip. For example, the upper chip 205 may be formed of a silicon substrate.

Since the upper chip 205 is stacked over the lower chip 203 so that each of the fuse opening portions 113 of the lower chip 203 is fully exposed from the upper surface 205 or fully covered with the upper chip 205, a filler 220b included in the sealing resin is prevented from being trapped in the fuse opening portions 113 at the time of resin sealing, the details of which will be described later.

The filler 220b is likely to be trapped in a fuse opening portion 113 located near an air vent, which is located at an opposite side to a portion to which a sealing resin is injected, because entrainment is caused near the air vent during molding. Therefore, the upper chip 205 may be arranged on the lower chip 203 such that at least any fuse opening portion 113 located closer to the air vent than the center of the lower chip 203 is not positioned below a corresponding edge of the upper chip 205.

For example, the fuse region 115 has a width of about 100 μm. If the center of the upper chip 205 is shifted (deviated) from the center of the lower chip 203 by about 100 μm, then the wires 217 can be connected to the wiring substrate 201 and the upper chip 205 without any change in position of the connection pads 223a, 223b, 223c, and 223d of the wiring substrate 201.

For example, the wires 215 and 217 are formed of a conductive metal such as Au. The wires 215 and 217 connect the electrode pads 103a, 103b, 107a, and 107b to the corresponding connection pads 223a, 223b, 223c, and 223d.

In this example, the wires 215 connect the electrode pads 103a to the connection pads 223a and connect the electrode pads 103b to the connection pads 223c. The wires 217 connect the electrode pads 107a to the connection pads 223b and connect the electrode pads 107b to the connection pads 223d.

As shown in FIG. 3, the sealing member 220 includes an insulating resin 220a and a filler 220b dispersed in the insulating resin 220a. The sealing member 220 seals the lower chip 203, the upper chip 205, and the wires 215 and 217 so that the first surface of the wiring substrate 201 is covered with the sealing member 220.

Next, a method of manufacturing a semiconductor device 200 will be described below with reference to FIGS. 4A to 7.

Figure 4A:
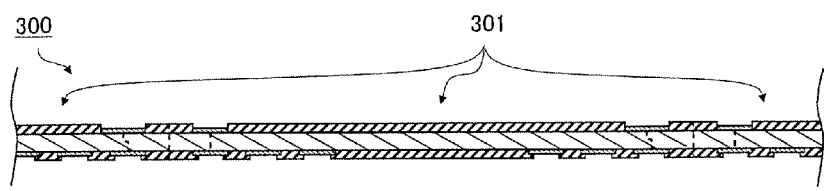
FIG. 4A is a diagram showing production of a semiconductor device according to the first embodiment of the present invention.

First, a base wiring substrate 300 as shown in FIG. 4A is prepared.

The base wiring substrate 300 includes a plurality of product formation portions 301 arranged in the form of a matrix. Each of the product formation portions 301 corresponds to a wiring substrate 201.

Figure 4B:
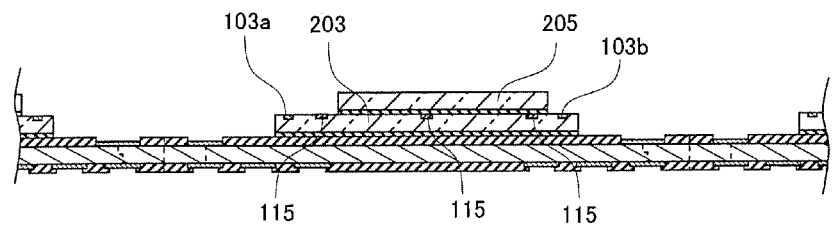
FIG. 4B is a diagram showing production of the semiconductor device according to the first embodiment of the present invention.

Next, as shown in FIG. 4B, a lower chip 203 is mounted on each of the product formation portions 301 of the base wiring substrate 300 by a chip mounter (not shown) and fixed by an adhesive member 105.

At that time, the lower chip 203 is mounted such that short sides 104a and 104b of the lower chip 203 on which electrode pads 103a and 103b are provided face opening portions 235a and 235c.

Subsequently, an upper chip 205 is mounted on and fixed to the lower chip 203 by a chip mounter (not shown) and fixed by an adhesive member 105.

At that time, the upper chip 205 is mounted so that each of fuse opening portions 113 of fuse regions 115 formed in the lower chip 203 is exposed from the upper chip 205 or covered with the upper chip 205.

Specifically, as shown in FIG. 1, the upper chip 205 is stacked over the lower chip 203 such that the center of the upper chip 205 is shifted from the center of the lower chip 203 in a direction in which long sides of the lower chip 203 extend.

Figure 4C:
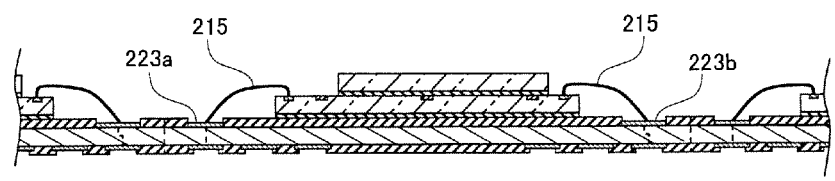
FIG. 4C is a diagram showing production of the semiconductor device according to the first embodiment of the present invention.

Then, as shown in FIG. 4C, the electrode pads 103a and 103b of the lower chip 203 are connected to corresponding connection pads 223a and 223c by wires 215. A wire bonding apparatus (not shown) may be used for connection with the wires 215. For example, wire connection is performed by ball bonding that uses an ultrasonic thermo-compression bonding method. Specifically, an end of each of the wires 215 where a ball has been formed by fusion is bonded to the electrode pad 103a or 103b by an ultrasonic thermo-compression bonding method. Another end of the wire 215 is bonded to the corresponding connection pad 223a or 223b by an ultrasonic thermo-compression bonding method so that the wire 215 draws a loop shape.

Similarly, electrode pads 107a and 107b of the upper chip 205 are connected to corresponding connection pads 223b and 223d by wires 217 (see FIG. 1).

Subsequently, a sealing member 220 is formed on a first surface of the base wiring substrate 300 by a batch molding process.

Specifically, the base wiring substrate 300 is first transferred to a molding apparatus 400.

Figure 5A:
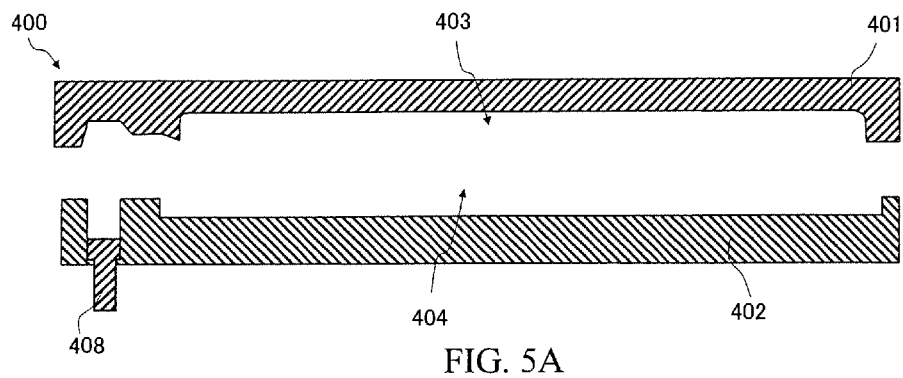
FIG. 5A is a diagram showing production of the semiconductor device according to the first embodiment of the present invention.

As shown in FIG. 5A, the molding apparatus 400 comprises a molding tool including an upper mold 401 and a lower mold 402. The upper mold 401 comprises a cavity 403, and the lower mold 402 includes a recessed portion 404 on which the base wiring substrate 300 is mounted.

The base wiring substrate 300 is set in the recessed portion 404 of the lower mold 402.

Figure 5B:
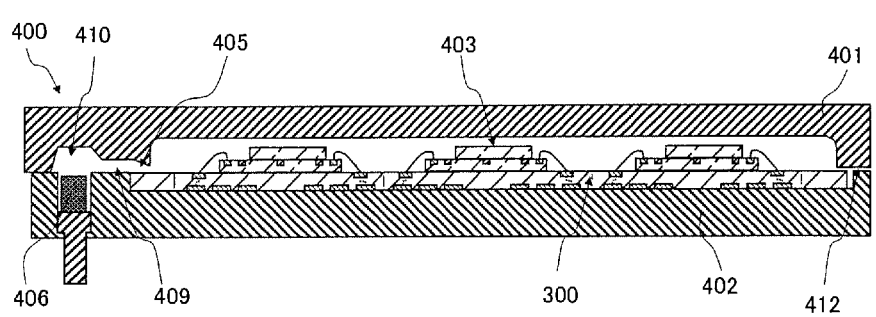
FIG. 5B is a diagram showing production of the semiconductor device according to the first embodiment of the present invention.

Thereafter, the upper mold 401 and the lower mold 402 are closed for molding the base wiring substrate 300. Thus, as shown in FIG. 5B, a certain volume of the cavity 403 and a gate portion 405 are formed above the base wiring substrate 300. In the present embodiment, a mold array package (MAP) method is used. Therefore, the size of the cavity 403 is large enough to collectively cover a plurality of product formation portions 301.

Next, as shown in FIG. 5B, a resin tablet 406 is supplied to a pot of the lower mold 402, heated, and melted therein.

Figure 5C:
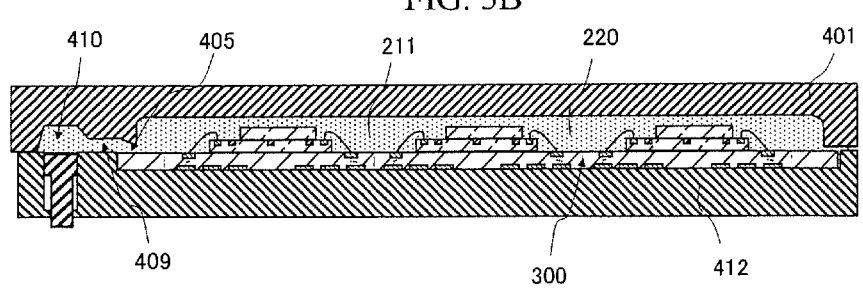
FIG. 5C is a diagram showing production of the semiconductor device according to the first embodiment of the present invention.

Subsequently, as shown in FIG. 5C, the molten sealing resin 211 is injected from the gate portion 405 toward an air vent 412 into the cavity 403 by a plunger 408. Thus, the cavity 403 is filled with the sealing resin 211.

When the cavity 403 is filled with the sealing resin 211, the sealing resin 211 is cured at a certain temperature, e.g., 180° C., and hence hardened.

Figure 7:
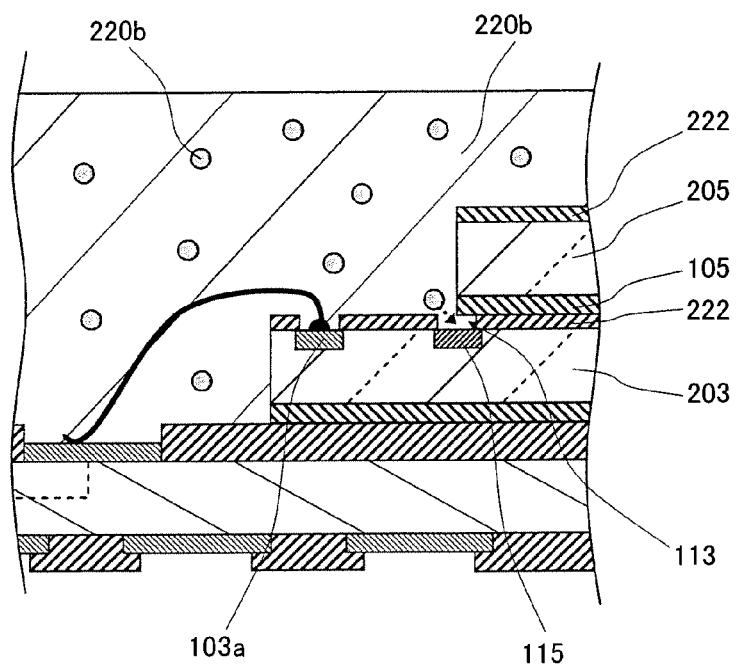
FIG. 7 is a cross-sectional view showing a filler to be trapped between a lower chip and an upper chip.

As described above, the sealing resin 211 includes the filler 220b therein. Therefore, the filler 220b may be trapped in a fuse opening portion 113 if an edge of the upper chip 205 is located above the fuse opening portion 113 as shown in FIG. 7.

However, the upper chip 205 is mounted on the lower chip 203 so that each of the fuse opening portions 113 of the fuse regions 115 formed in the lower chip 203 is exposed from the upper chip 205 or covered with the upper chip 205. Therefore, the filler 220b is prevented from being trapped between the edge of the upper chip 205 and the fuse opening portions 113. Accordingly, the sealing resin 211 can satisfactorily be filled in the cavity 403.

As a result, it is possible to reduce defects of a circuit or a wire that would be broken by the filler 220b trapped in a fuse opening portion 113 that presses a circuit or a wire near a fuse under pressure applied when the sealing resin 211 is filled or when the sealing resin 211 is hardened and shrunk. Accordingly, a semiconductor device 200 can be provided with high reliability.

Figure 5D:
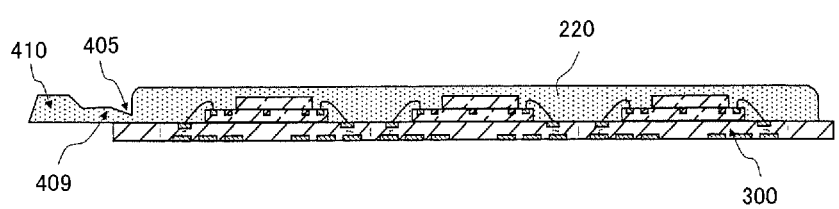
FIG. 5D is a diagram showing production of the semiconductor device according to the first embodiment of the present invention.
Figure 6A:
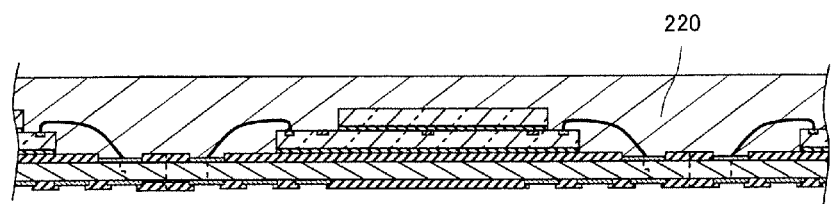
FIG. 6A is a diagram showing production of the semiconductor device according to the first embodiment of the present invention.

When the sealing resin 211 has been hardened, the upper mold 401 and the lower mold 402 are separated to pick the base wiring substrate 300 up. Then the base wiring substrate 300 is subjected to a reflow process at a certain temperature, e.g., 240° C., so that the sealing resin 211 is completely hardened. Thus, the sealing member 220 collectively covers a sealing region of the base wiring substrate 300 as shown in FIGS. 5D and 6A. Then the gate portion 405, a runner portion 409, and a cull portion 410 connected to the sealing member 220 as shown in FIG. 5D are removed.

Figure 6B:
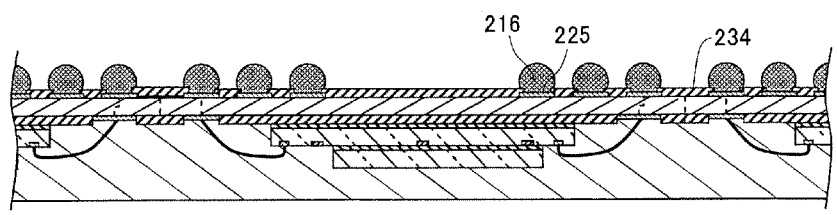
FIG. 6B is a diagram showing production of the semiconductor device according to the first embodiment of the present invention.

Subsequently, as shown in FIG. 6B, solder balls 216 are mounted on land portions 225 formed on a second surface of the base wiring substrate 300.

Specifically, for example, the solder balls 216 are mounted by using a suction mechanism (not shown) comprising a plurality of suction holes arranged so as to correspond to the land portions 225 on the wiring substrate 201. The solder balls 216 are held by the suction holes and collectively mounted on the land portions 225 of the wiring substrate 201 via a flux.

After the solder balls 216 are mounted on all of the product formation portions 301, the wiring substrate 201 is subjected to a reflow process so that the solder balls 216 are fixed.

Figure 6C:
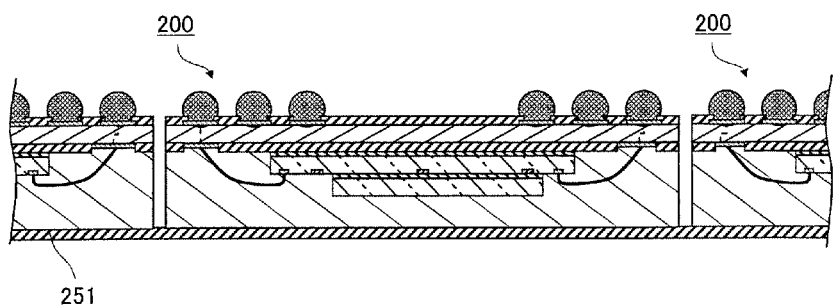
FIG. 6C is a diagram showing production of the semiconductor device according to the first embodiment of the present invention.

Next, as shown in FIG. 6C, the sealing member 220 is attached to a dicing tape 251, so that the sealing member 220 and the base wiring substrate 300 are supported by the dicing tape 251. Then the base wiring substrate 300 and the sealing member 220 are cut lengthwise and crosswise along dicing lines 234 (see FIG. 6B) by using a dicing blade (not shown). Thus, the base wiring substrate 300 is divided and separated into the product formation portions 301. The separated product formation portions 301 and the sealing member 220 are picked up from the dicing tape 251. In this manner, semiconductor devices 200 as shown in FIG. 1 are obtained.

This is how to manufacture a semiconductor device 200.

As described above, according to the first embodiment, the semiconductor device 200 comprises a wiring substrate 201, a lower chip 203 mounted on a surface of the wiring substrate 201, and an upper chip 205 mounted on the lower chip 203. The lower chip 203 includes a plurality of fuse opening portions 113. The upper chip 205 is arranged so that each of the fuse opening portions 113 is fully covered with the upper chip 205 or fully exposed from the upper chip 205.

Therefore, it is possible to reduce defects of a circuit or a wire that would be broken by a filler 220b trapped in a fuse opening portion 113 that presses a circuit or a wire near a fuse under pressure applied when a sealing resin 211 is filled or when a sealing resin 211 is hardened and shrunk. Accordingly, a semiconductor device 200 can be provided with high reliability.

Next, a second embodiment of the present invention will be described with reference to FIGS. 8 and 9.

The second embodiment differs from the first embodiment in that an upper chip 205a has an arrangement of electrode pads and circuits that is different from that of the lower chip 203.

In the second embodiment, components having the same functions as those in the first embodiment are denoted by the same reference numerals. The following description is focused on differences from the first embodiment.

Figure 8:
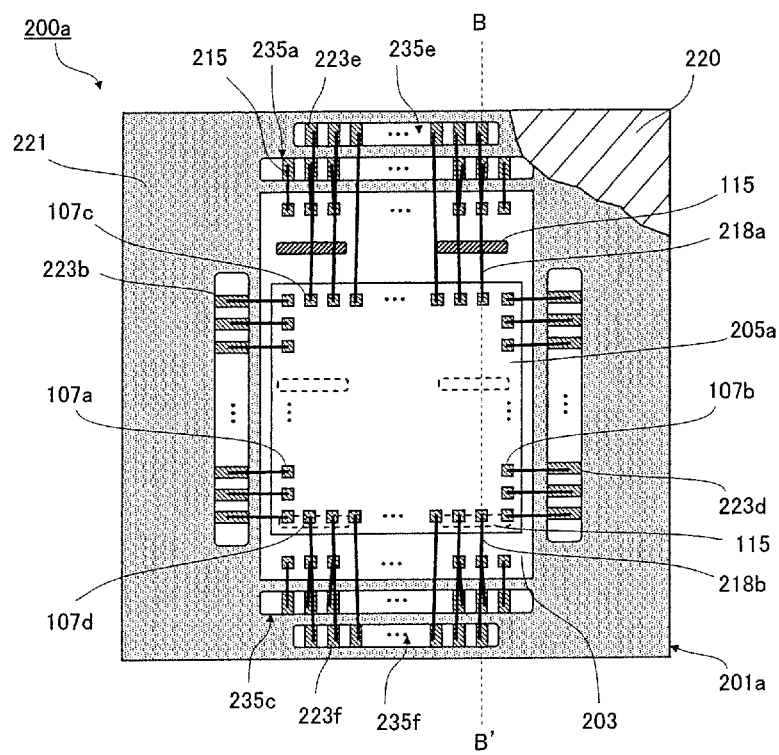
FIG. 8 is a plan view showing a semiconductor device according to a second embodiment of the present invention, in which only part of a sealing member is illustrated.
Figure 9:
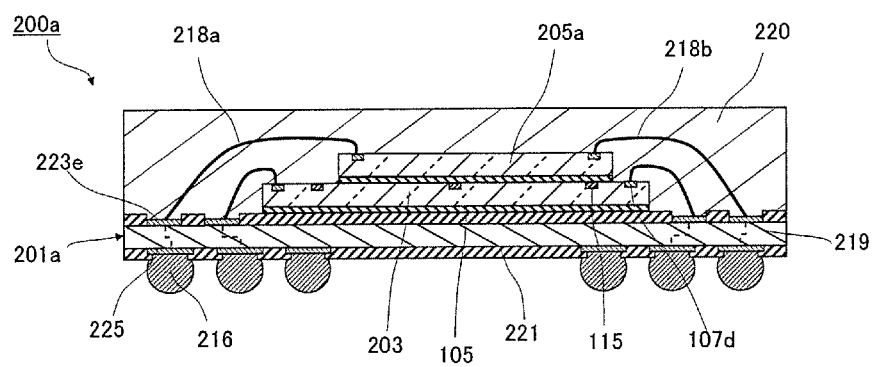
FIG. 9 is a cross-sectional view taken along line B-B' of FIG. 8.

As shown in FIGS. 8 and 9, a semiconductor device 200a according to the second embodiment of the present invention comprises an upper chip 205a including an arrangement of electrode pads and circuits that is different from that of the lower chip 203.

Specifically, the upper chip 205a has a square shape in plan view. The upper chip 205a includes electrode pads 107a, 107b, 107c, and 107d formed along four sides of the square.

Furthermore, opening portions 235e and 235f are formed outside of the opening portions 235a and 235c in the insulator film 221 on the wiring substrate 201a. Connection pads 223e and 223f are disposed in the opening portions 235e and 235f.

The connection pads 223e and 223f face the electrode pads 107c and 107d, respectively. The connection pads 223e and 223f are connected to the electrode pads 107c and 107d by wires 218a and 218b. The length of each of the wires 218a is larger than that of the wires 218b.

The upper chip 205a is stacked over the lower chip 203 so that each of the fuse opening portions 113 of the fuse regions 115 in the lower chip 203 is fully covered with or fully exposed from the upper chip 205a. In FIG. 8, the fuse opening portions 113 located near the opening portion 235e are fully exposed from the upper chip 205a, and the fuse opening portions 113 located near the opening portion 235f are fully covered with the upper chip 205a.

Thus, the structure of the upper chip 205a does not need to be the same as that of the lower chip. In this case, if the upper chip 205a is stacked over the lower chip 203 so that each of the fuse opening portions 113 of the fuse regions 115 in the lower chip 203 is fully covered with or fully exposed from the upper chip 205a, the filler 220b included in the sealing member 220 is prevented from being trapped in the fuse opening portions 113 of the fuse regions 115. Accordingly, the second embodiment exhibits the same advantageous effects as the first embodiment.

With this arrangement, a gate portion used for filling the sealing member 220 is provided near the opening portion 235e (on a side on which the fuse opening portions 113 are exposed). Specifically, the gate portion is provided near longer ones of the wires 218a and 218b. In this manner, when the gate portion is provided near longer ones of the wires 218a and 218b, generation of a short-circuited wire that would be caused near an air vent by entrainment of the sealing resin can be prevented upon sealing with resin.

A method of manufacturing the semiconductor device 200a is the same as described in the first embodiment, and the explanation thereof is omitted herein.

As described above, according to the second embodiment, the semiconductor device 200a comprises a wiring substrate 201a, a lower chip 203 mounted on a surface of the wiring substrate 201, and an upper chip 205a mounted on the lower chip 203. The lower chip 203 includes a plurality of fuse opening portions 113. The upper chip 205a is arranged so that each of the fuse opening portions 113 is fully covered with or fully exposed from the upper chip 205a.

Therefore, the second embodiment exhibits the same advantageous effects as in the first embodiment.

Next, a third embodiment of the present invention will be described with reference to FIG. 10.

The third embodiment differs from the first embodiment in that a third chip 207 is provided on the upper chip 205 so that the upper chip 205 serves as a spacer between the lower chip 203 and the third chip 207.

In the third embodiment, components having the same functions as those in the first embodiment are denoted by the same reference numerals. The following description is focused on differences from the first embodiment.

Figure 10:
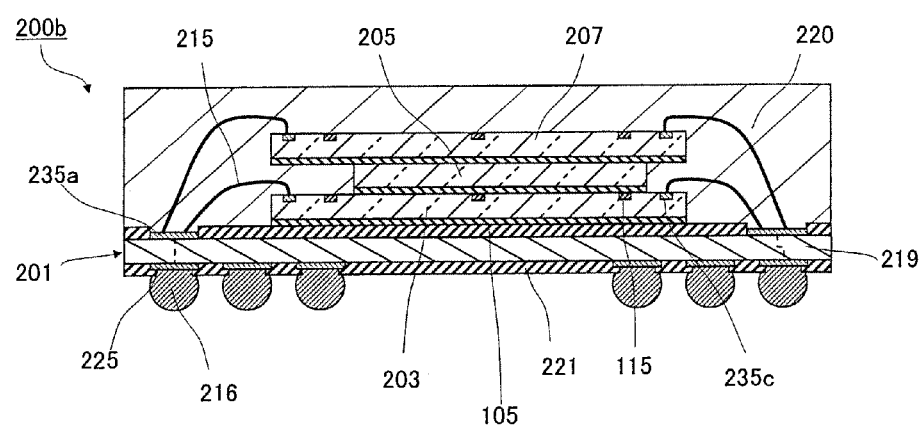
FIG. 10 is a cross-sectional view showing a semiconductor device according to a third embodiment of the present invention.

As shown in FIG. 10, a semiconductor device 200b according to the third embodiment comprises a third chip 207 provided on the upper chip 205. The upper chip 205 is used as a spacer between the lower chip 203 and the third chip 207.

In this case, the upper chip 205 is stacked over the lower chip 203 so that each of the fuse opening portions 113 of the fuse regions 115 in the lower chip 203 is fully covered with or fully exposed from the upper chip 205.

Since the upper chip 205 is used as a spacer, the upper chip 205 may not be a semiconductor chip and, for example, may be a silicon substrate.

In this manner, the number of chips stacked over the lower chip 203 is not necessarily one. A plurality of chips may be stacked over the lower chip 203. In this case, if a chip is stacked adjacent to the lower chip 203 so that each of the fuse opening portions 113 of the fuse regions 115 in the lower chip 203 is fully covered with or fully exposed from the chip, a filler included in the sealing member 220 is prevented from being trapped in the fuse opening portions 113 of the fuse regions 115.

A method of manufacturing the semiconductor device 200b is the same as described in the first embodiment, and the explanation thereof is omitted herein.

As described above, according to the third embodiment, the semiconductor device 200b comprises a wiring substrate 201a, a lower chip 203 mounted on a surface of the wiring substrate 201, and an upper chip 205 mounted on the lower chip 203. The lower chip 203 includes a plurality of fuse opening portions 113. The upper chip 205 is arranged so that each of the fuse opening portions 113 is fully covered with or fully exposed from the upper chip 205.

Therefore, the third embodiment exhibits the same advantageous effects as in the first embodiment.

Next, a fourth embodiment of the present invention will be described with reference to FIGS. 11 and 12.

The fourth embodiment differs from the first embodiment in that an upper chip 205b is stacked so that fuse regions located near an air vent are fully covered with or fully exposed from the upper chip 205b.

In the fourth embodiment, components having the same functions as those in the first embodiment are denoted by the same reference numerals. The following description is focused on differences from the first embodiment.

Figure 11:
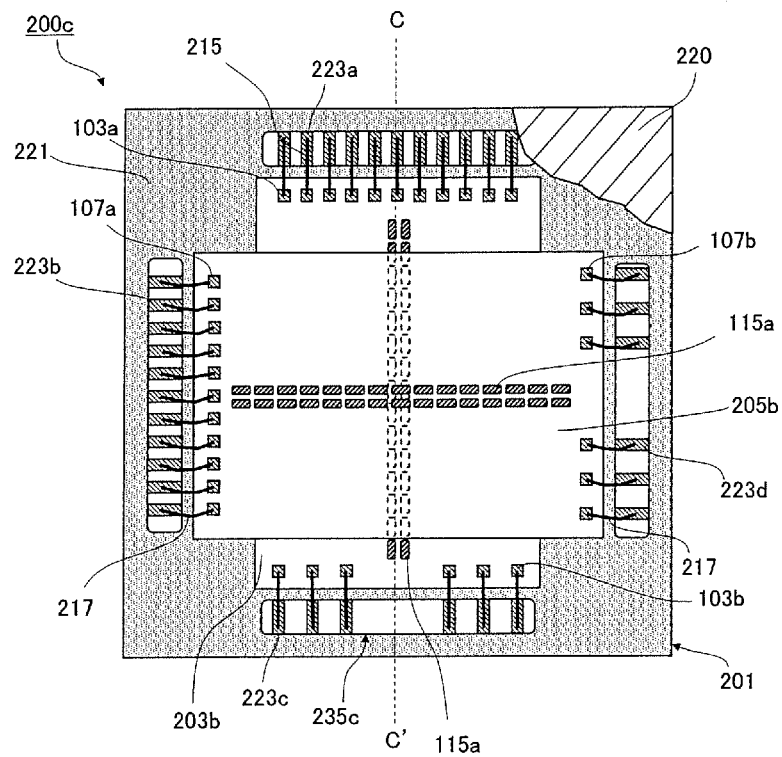
FIG. 11 is a plan view showing a semiconductor device according to a fourth embodiment of the present invention, in which only part of a sealing member is illustrated.
Figure 12:
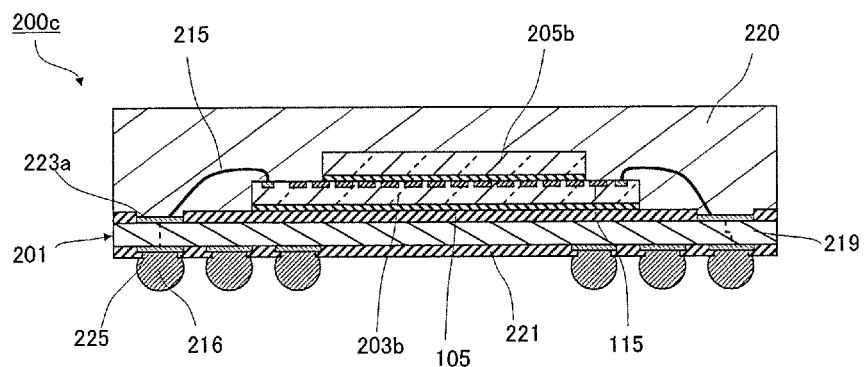
FIG. 12 is a cross-sectional view taken along line C-C' of FIG. 11.

As shown in FIGS. 11 and 12, a semiconductor device 200c according to the fourth embodiment comprises a wiring substrate 201, a lower chip 203b stacked over the wiring substrate 201, and an upper chip 205b stacked over the lower chip 203b. Those two memory chips are substantially in the form of a rectangular plate (rectangular shape in plan view). Some circuits are formed on a surface of each of the chips. Furthermore, a plurality of electrode pads 103a, 103b, electrode pads 107a, and 107b are arranged on the surface of each of the memory chips along short sides of the chip.

A plurality of fuse regions 115a are provided on the surface of each of the lower chip 203b and the upper chip 205b along long sides of the chip. The upper chip 205b is stacked so that only the fuse regions 115a located near one of short sides of the lower chip 203b are fully covered with or fully exposed from the upper chip 205b.

The fourth embodiment adopts such an arrangement as follows:

As described above, the upper chip 205b is preferably stacked over the lower chip 203b so that each of the fuse opening portions 113 of the fuse regions 115a in the lower chip 203b is fully covered with or fully exposed form the upper chip 205b.

Meanwhile, it may be difficult to stack the upper chip 205b on the lower chip 203b so that each of the fuse regions 115a is fully covered with or fully with exposed from the upper chip 205b in view of the arrangement of the fuse regions 115a or the chip size of the upper chip 205b.

For example, in FIG. 11, distances between the fuse regions 115a of the lower chip 203b do not match the length of the short sides of the upper chip 205b. Accordingly, some fuse regions 115a of the lower chip 203b are located right below an edge of one of the long sides of the upper chip 205b no matter how the upper chip 205b is arranged.

In this case, however, the upper chip 205b is stacked so that the fuse regions 115a located near the air vent, which is likely to cause the filler 220b to be trapped during molding because of entrainment of the sealing member 220, are fully covered with or fully exposed from the upper chip 205b. With this configuration, the filler 220b is prevented from being trapped.

The wires 217, which extend perpendicular to a direction in which the sealing member 220 is injected, are deflected toward the air vent by a flow of the resin during molding. Therefore, the semiconductor device 200c may be configured such that the fuse regions 115a of the lower chip 203b located in the deflection direction of the wires 217 are fully covered with or fully exposed from the upper chip 205b.

A larger number of electrode pads 103a and 107a are arranged on one of the short sides of each of the lower chip 203b and the upper chip 205b as compared to electrode pads 103b and 107b arranged on the other short side. Alternatively, the electrode pads 103a and 107a are arranged with a narrower pitch on one of the short sides of each of the lower chip 203b and the upper chip 205b.

For example, in FIG. 11, the electrode pads 103a are arranged with a narrower pitch than the electrode pads 103b, and the electrode pads 107a are arranged with a narrower pitch than the electrode pads 107b. Furthermore, the connection pads 223a, 223b, 223c, and 223d are configured so as to correspond to the electrode pads 103a, 103b, 107a, and 107b. Specifically, the connection pads 223a are arranged with a narrower pitch than the connection pads 223c, and the connection pads 223b are arranged with a narrower pitch than the connection pads 223d.

With this configuration, the sealing resin is supplied from a side including a larger number of pads in the lower chip 203b into a side including a smaller number of pads in the lower chip 203b. Thus, a short-circuited wire or a drifted wire is prevented from being caused by entrainment of the sealing member 220 during molding.

For example, in FIG. 11, a gate is provided on the side C, and an air vent is provided on the side C'. Therefore, all of the fuse regions 115a that are located on the side C' of the air vent are fully covered with or fully exposed from the upper chip 205b. Moreover, overhanging portions of the upper chip 205b are arranged along the direction in which the resin is injected. Accordingly, voids are prevented from being generated below the overhanging portions.

As described above, according to the fourth embodiment, the semiconductor device 200b comprises a wiring substrate 201a, a lower chip 203b mounted on a surface of the wiring substrate 201, and an upper chip 205b mounted on the lower chip 203b. The lower chip 203b includes a plurality of fuse opening portions 113. The upper chip 205b is arranged so that each of the fuse opening portions 113 located near an air vent is fully covered with or fully exposed from the upper chip 205b.

Therefore, the fourth embodiment exhibits the same advantageous effects as in the first embodiment.

Although the inventions has been described above in connection with several preferred embodiments thereof, it will be appreciated by those skilled in the art that those embodiments are provided solely for illustrating the invention, and should not be relied upon to construe the appended claims in a limiting sense.

For example, in the above embodiments, two semiconductor chips are stacked. Nevertheless, the present invention is applicable to a semiconductor device comprising three or more semiconductor chips being stacked. In such a case, any upper semiconductor chip is stacked over a lower semiconductor chip so that each of opening portions of fuse regions in the lower semiconductor chip is fully covered with or fully exposed from the upper semiconductor chip.

In the above embodiments, the present invention is applied to a semiconductor device comprising two memory chips. Nevertheless, the present invention may be applied to any combination of semiconductor chips such as a logic chip and a memory chip so long as a lower semiconductor chip includes opening portions of fuse regions.

What is claimed is:

1. A semiconductor device comprising:
a wiring substrate;
a lower chip mounted over a surface of the wiring substrate, the lower chip including a plurality of fuse opening portions;
an upper chip stacked over the lower chip, some of the plurality of the fuse opening portions are fully covered by the upper chip, and a remainder of the plurality of the fuse opening portions are fully exposed from the upper chip; and
a sealing member formed on the surface of the wiring substrate so that the lower chip and the upper chip are covered with the sealing member.

2. The semiconductor device as recited in claim 1, wherein each of the lower chip and the upper chip is a semiconductor chip.

3. The semiconductor device as recited in claim 1, wherein the lower chip includes first and second edges opposite to each other, a plurality of first electrodes formed along the first edge and a plurality of second electrodes formed along the second edge, the number of the first electrodes are greater than the number of the second electrodes, and the center of the upper chip is deviated from the center of the lower chip toward the second edge.

4. The semiconductor device as recited in claim 1, wherein the lower chip includes a first region, a second region, a third region defined between the first and second regions, and a plurality of fuse regions, and wherein the upper chip is stacked over the third region of the lower chip so that the first region including an area smaller than that of the second region, and exposes all of the plurality of fuse regions formed in the second region.

5. The semiconductor device as recited in claim 1, wherein the sealing member comprises a resin including a filler.

6. The semiconductor device as recited in claim 1, wherein each of the plurality of fuse opening portions has an elongated shape.

7. The semiconductor device as recited in claim 6, wherein each of the plurality of fuse opening portions has a rectangular shape with long sides being substantially parallel to a short side of the lower chip.

8. The semiconductor device as recited in claim 6, wherein each of the plurality of fuse opening portions is arranged along a long side of the lower chip.

9. The semiconductor device as recited in claim 1, wherein the lower chip having a rectangular shape in plan view, the lower chip including a plurality of electrode pads arranged along short sides of the lower chip, and wherein the upper chip having a rectangular shape in plan view, the upper chip being stacked over the lower chip so that long sides of the upper chip are in substantially parallel to short sides of the lower chip.

10. A semiconductor device comprising:
a wiring substrate including a plurality of connection pads formed on a surface thereof;
a lower chip having a rectangular shape in plan view, the lower chip including a plurality of electrode pads arranged along short sides of the lower chip and a plurality of fuse opening portions; the lower chip being mounted over the surface of the wiring substrate;
a plurality of bonding wires electrically connecting the plurality of connection pads to the plurality of electrode pads;
an upper chip having a rectangular shape in plan view, the upper chip being stacked over the lower chip so that short sides of the upper chip are in parallel to long sides of the lower chip, and
a sealing member formed on the surface of the wiring substrate so that the lower chip and the upper chip are covered with the sealing member,
some of the plurality of the fuse opening portions are fully covered by the upper chip, and a remainder of the plurality of the fuse opening portions are fully exposed from the upper chip.

11. The semiconductor device as recited in claim 10, wherein each of the lower chip and the upper chip is a semiconductor chip.

12. The semiconductor device as recited in claim 10, wherein each of the plurality of fuse opening portions is fully covered with or fully exposed from the upper chip.

13. The semiconductor device as recited in claim 12, wherein the plurality of electrode pads and the plurality of fuse opening portions are arranged so that more electrode pads are arranged along a short side than along the other short side of the lower chip, and so that the fully exposed fuse opening portions are close to the short side having more electrode pads.

14. The semiconductor device as recited in claim 10, wherein the sealing member comprises a resin including a tiller.

15. The semiconductor device as recited in claim 10, wherein a center of the upper chip is shifted from a center of the lower chip.

16. The semiconductor device as recited in claim 15, wherein each of the plurality of fuse opening portions has a rectangular shape with long sides being substantially parallel to a short side of the lower chip.

17. The semiconductor device as recited in claim 15, wherein each of the plurality of fuse opening portions is arranged along a long side of the lower chip.

18. The semiconductor device as recited in claim 15, wherein the upper chip comprises a second plurality of fuse opening portions having a rectangular shape, and wherein each of the second plurality of fuse opening portions is arranged along a long side of the upper chip.

19. The semiconductor device as recited in claim 10, wherein each of the plurality of fuse opening portions has an elongated shape.

* * * * *